US005517147A

United States Patent [19]
Burroughs et al.

[11] Patent Number: 5,517,147
[45] Date of Patent: May 14, 1996

[54] MULTIPLE-PHASE CLOCK SIGNAL GENERATOR FOR INTEGRATED CIRCUITS, COMPRISING PLL, COUNTER, AND LOGIC CIRCUITS

[75] Inventors: William G. Burroughs, Exton; Andrew Neely, Norristown; Joseph A. Manzella, Collegeville, all of Pa.

[73] Assignee: Unisys Corporation, Blue Bell, Pa.

[21] Appl. No.: 341,523

[22] Filed: Nov. 17, 1994

[51] Int. Cl.⁶ ...................................................... H03K 3/00
[52] U.S. Cl. ........................... 327/295; 327/291; 327/269; 327/284; 377/78
[58] Field of Search ............................ 327/291, 292–299, 327/141, 156, 158, 159, 160, 284; 326/93–98; 331/7 A, 17, 25, 57, DIG. 2; 375/375, 376

[56] References Cited

U.S. PATENT DOCUMENTS

| | | | |
|---|---|---|---|
| 3,168,700 | 2/1965 | Gesek | 328/62 |
| 3,325,741 | 6/1967 | Arya | 328/62 |
| 3,327,225 | 6/1967 | Schell | 328/62 |
| 3,448,295 | 6/1969 | Wanlass | 307/260 |
| 3,493,884 | 2/1970 | Kulp | 331/17 |
| 3,539,938 | 11/1970 | Heimbigner | 331/57 |
| 3,590,280 | 6/1971 | Hudson | 307/269 |
| 3,801,827 | 4/1974 | Sequin | 307/223 |
| 3,921,079 | 11/1975 | Heffner | 328/62 |
| 4,417,158 | 11/1983 | Ito | 307/269 |
| 4,475,085 | 10/1984 | Yahata et al. | 327/160 |
| 4,554,465 | 11/1985 | Koike | 307/269 |
| 4,654,599 | 3/1987 | Zbinden | 328/62 |
| 4,692,932 | 9/1987 | Denhez et al. | 375/107 |
| 4,877,974 | 10/1989 | Kawai | 307/269 |
| 5,124,572 | 6/1992 | Mason et al. | 327/295 |
| 5,128,554 | 7/1992 | Hoshizaki | 327/147 |
| 5,142,247 | 8/1992 | Lada, Jr. et al. | 331/14 |
| 5,173,617 | 12/1992 | Alsup et al. | 327/158 |
| 5,204,555 | 4/1993 | Graham et al. | 327/156 |
| 5,373,254 | 12/1994 | Nakauchi et al. | 331/14 |

OTHER PUBLICATIONS

Motorola, *H4C™ Series CMOS Gate Arrays Design Reference Guide*, Preliminary, 1993.
IBM Microelectronics Division, *Penta CMOS5L Logic Products Data Book*, Preliminary, V1.1, Nov. 15, 1993.

*Primary Examiner*—Timothy P. Callahan
*Assistant Examiner*—Kenneth B. Wells
*Attorney, Agent, or Firm*—Woodcock Washburn Kurtz Mackiewicz & Norris

[57] ABSTRACT

A multiple-phase clock signal generator includes a phase-locked loop (PLL) for generating an oscillating signal having a predetermined frequency, a counter driven by the oscillating signal and having a plurality of outputs, and a plurality of combinational logic gates each having a plurality of inputs and an output. Selected ones of the inputs of each combinational logic gate are coupled to selected outputs of the counter to produce, at the output of each combinational logic gate, a clock signal having a particular phase. Different combinations of the outputs of the counter can be used to generate different phases.

18 Claims, 5 Drawing Sheets

MULTIPLE-PHASE CLOCK SIGNAL GENERATOR FOR INTEGRATED CIRCUITS, COMPRISING PLL, COUNTER, AND LOGIC CIRCUITS

FIELD OF THE INVENTION

The present invention relates to electronic digital computer systems, and more particularly, to a clock generation scheme for generating multiple phase clock signals in an integrated circuit.

BACKGROUND

Integrated circuits, including application specific integrated circuits (ASICs), typically comprise a number of internal storage elements and latches. It is often desirable to clock these elements using different phases of a clock signal. For example, a master-slave latch typically requires two separate phases, one to clock the master latch and the other to clock the slave. A number of prior art schemes have been developed to generate multiple-phase clock signals. Unfortunately, prior art clock generation schemes suffer from a number of drawbacks.

One prior art phase generation scheme uses a clock distribution tree to distribute a single clock phase throughout the integrated circuit. To produce a second phase at selected storage elements, an inverter is inserted at the end of the clock tree. The normal clock signal provides one phase, while the output of the inverter provides a second phase. Such a scheme is disadvantageous, especially in CMOS integrated circuits. Because of the large process variations inherent in CMOS circuits, the delay through inverters at different locations within the circuit is likely to vary, producing a high degree of skew in the second phase.

Performance of an integrated circuit can be enhanced by minimizing skew between the various phases generated by a multiple-phase clock signal generator and by precisely controlling the placement of the clock edges of different phases. Some prior art phase generation schemes are disadvantageous, particularly in master-slave latch designs, because they do not provide precise edge placement and often introduce a measurable delay between the falling edge of the master latch clock phase and the rising edge of the slave latch clock phase.

A number of prior art phase generation schemes use a single 2× clock to generate two different clock signal phases. Unfortunately, these prior art schemes cannot produce more than two phases from the single high frequency clock. Many integrated circuits require four or more different phases of a clock signal to control the wide variety of storage elements in the circuit.

Given the disadvantages of many prior art phase generation schemes, there is a need for a multiple-phase clock signal generator for use in integrated circuit applications that achieves very precise edge placement and minimizes skew between the various phases. Additionally, such a multiple-phase clock signal generator should be suitable for use in CMOS integrated circuits despite the large process variations that occur throughout a CMOS circuit. Lastly, any such multiple-phase clock signal generator should be capable of producing two or more phases of a clock signal from a single high frequency clock. The present invention satisfies these needs.

SUMMARY OF THE INVENTION

The present invention is directed to a multiple-phase clock signal generator for use in integrated circuit applications, and in particular, application specific integrated circuit applications. A counter is driven by a high frequency oscillating signal, and combinational logic is employed to combine the outputs of the counter in various ways to produce a number of different clock phases. The multiple-phase clock signal generator of the present invention achieves very precise edge placement and minimizes both chip-to-chip and on-chip skew. The multiple-phase clock signal generator of the present invention is extremely advantageous in CMOS integrated circuit applications where large process variations can interfere with high performance.

An on-chip phase-locked loop is preferably employed to generate the high frequency signal that drives the counter. The phase-locked loop (PLL) receives an external clock signal and steps up the external signal to provide the high frequency signal to the counter. According to an important feature of the present invention, one of the generated clock phases is fed back to the feedback input of the PLL to ensure close synchronization with the external clock signal. By utilizing the PLL to synchronize the generated clock phases to the external clock signal, a great reduction in chip-to-chip skew can be achieved in multi-chip applications wherein each chip employs the multiple-phase clock signal generator of the present invention.

A number of additional techniques are employed to further reduce internal skew. For example, a duplicating register is coupled between the outputs of the counter and the respective inputs of the combinational logic for duplicating the outputs of the counter to minimize loading on the counter outputs. Additionally, the counter outputs are coupled to the inputs of the combinational logic so as to equalize the delay paths of the counter outputs through the combinational logic. Also, identical clock distribution trees are used to distribute each of the clock phases to the elements of an integrated circuit. These and other techniques described hereinafter combine to minimize internal skew in the integrated circuit.

According to yet another feature of the present invention, the combinational logic that generates the various clock signal phases is provided with one or more control inputs for controlling the outputs of the combinational logic for purposes of initialization, testing and maintenance of circuit functions. By integrating the control inputs into the combinational logic that generates the various clock signal phases, the multiple-phase clock signal generator of the present invention is able to provide standard initialization, testing and maintenance capabilities without affecting the critical AC paths of the clock signals.

Other features and advantages of the present invention will become evident hereinafter.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings embodiments that are presently preferred, it being understood, however, that the invention is not limited to the specific methods and instrumentalities disclosed. In the drawings.

DETAILED DESCRIPTION OF THE PREFERRED EMBODIMENTS

Figure 1:
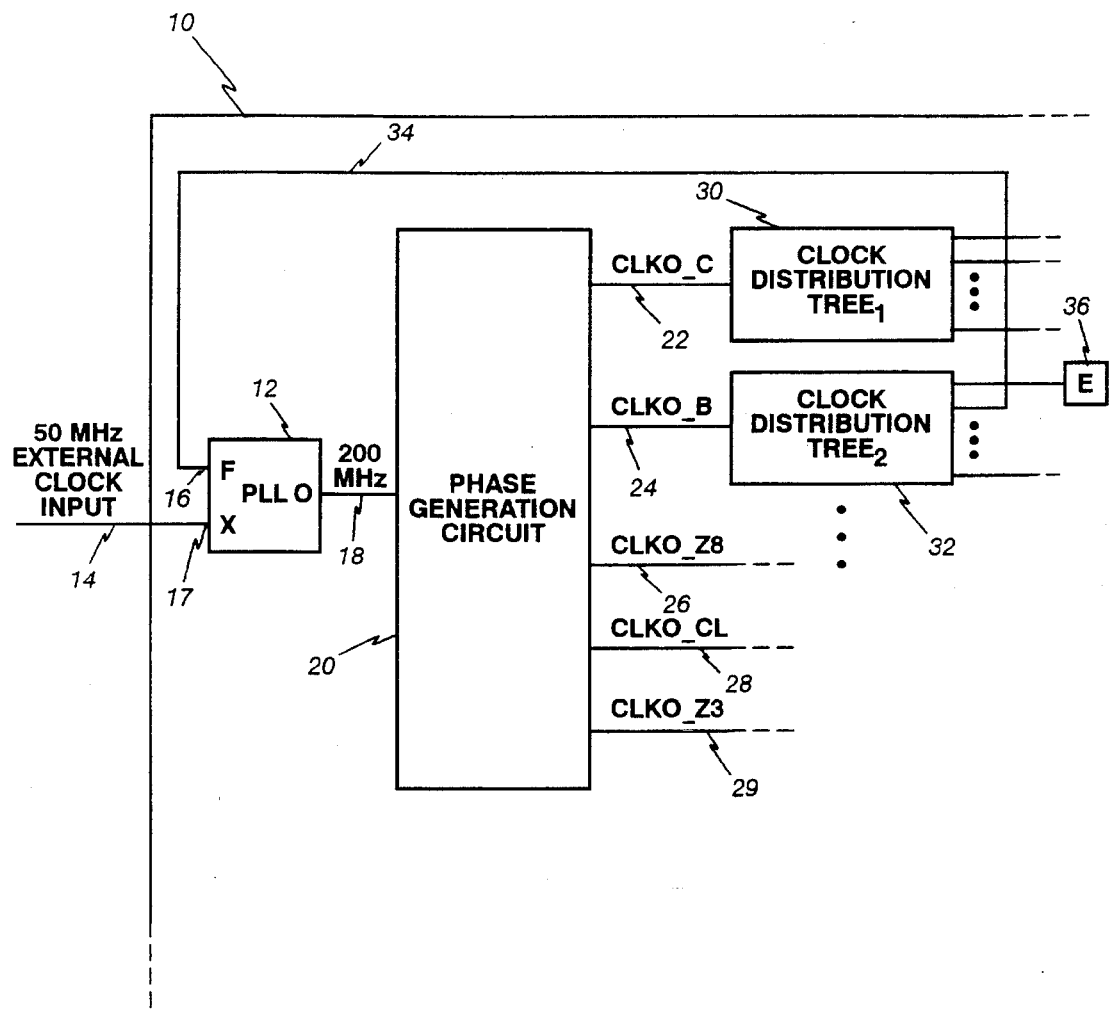
FIG. 1 is a high-level block diagram of an integrated circuit chip embodying a multiple-phase clock signal generator in accordance with a first embodiment of the present invention.

Referring to the drawings, wherein like numerals indicate like elements throughout, there is shown in FIG. 1 a high level block diagram of an integrated circuit 10 embodying a multiple-phase clock signal generator in accordance with a first embodiment of the present invention. In this first embodiment, all components of the multiple-phase clock signal generator are internal to the integrated circuit 10. According to the present invention, the multiple-phase clock signal generator comprises a phase-locked loop (PLL) 12, a phase generation circuit 20 and a plurality of clock distribution trees, e.g. 30 and 32. An external oscillator (not shown) provides a 50 MHz clock signal to the integrated circuit on line 14. The PLL receives the 50 MHz external clock signal at a clock input 17 and provides, on line 18, a high frequency oscillating signal. In the present embodiment, the 50 MHz external clock signal is stepped up to 200 MHz by the PLL 12, and the PLL then provides the 200 MHz signal on line 18.

The high frequency oscillating signal provided on line 18 is fed to a phase generation circuit 20 which, as described hereinafter in greater detail, produces a plurality of clock signals of various phases denoted herein as $CLKO_{13}C$, $CLKO_{13}B$, $CLKO_{13}Z8$, $CLKO_{13}CL$ and $CLKO\_Z3$. Each phase is fed to a respective clock distribution tree, e.g. 30, 32, that distributes the particular clock phase throughout the integrated circuit for use in controlling storage elements, e.g. element 36, within the integrated circuit. In accordance with the present invention, each of the clock distribution trees has identical delay paths in order to minimize skew between the different phases.

According to an important feature of the first embodiment, one of the clock signal phases is fed back to a feedback input 16 of the PLL 12. Particularly, the phase denoted $CLKO_{13}B$ is fed back via line 34 from an end of its respective clock distribution tree 32 to the feedback input 16 of the PLL 12. The PLL dynamically compensates for process, temperature, and voltage variations by comparing the phase of the incoming external clock signal to the phase of the clock signal fed back on line 34 (e.g., $CLKO_{13}B$). The PLL adjusts the absolute frequency of the high frequency oscillating signal output on line 18 to compensate for any differences detected between the phase of the external clock signal received on line 14 and the phase of the generated clock signal (CLKO_B) fed back to the PLL 12 on line 34. As can be appreciated, the feedback provided to the PLL helps to reduce chip-to-chip skew in a multi-chip system since the PLL in each chip will ensure that the distributed clock signals remain synchronized to the same external clock (e.g., the 50 MHz external clock provided on line 14).

Figure 2A:
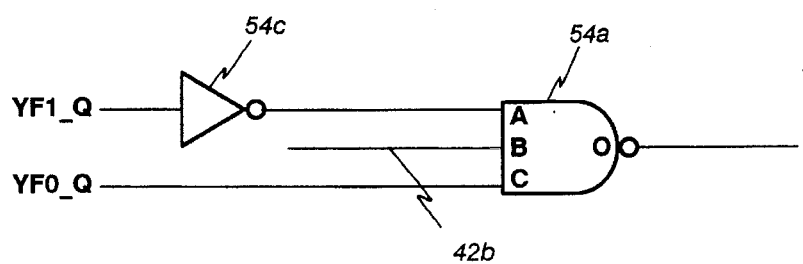
FIG. 2a is an enlarged block diagram of a portion of the multiple-phase clock signal generator of FIG. 2.
Figure 2:
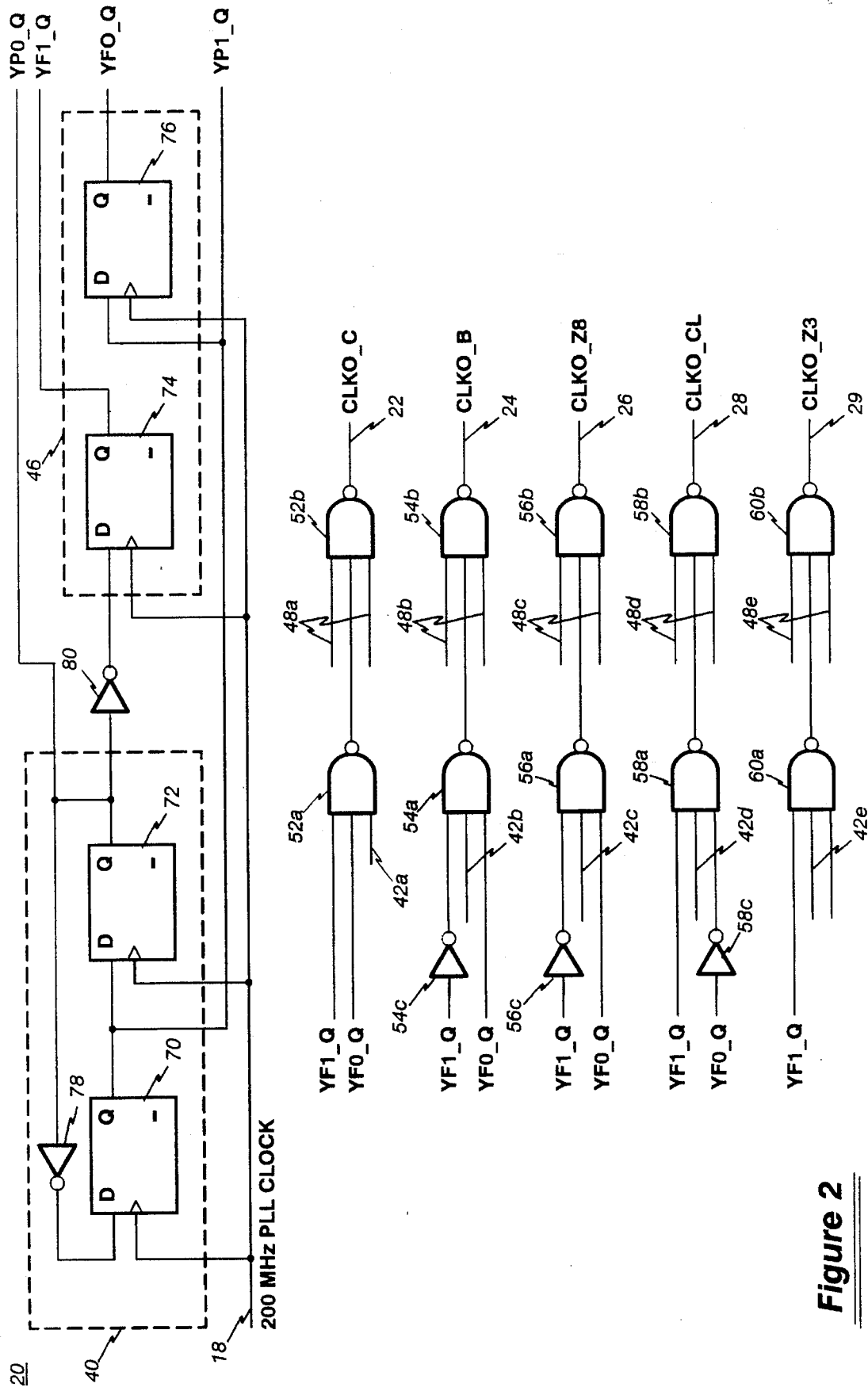
FIG. 2 is a block diagram illustrating further details of the multiple-phase clock signal generator of FIG. 1.

FIG. 2 is a block diagram showing further details of the phase generation circuit 20 of FIG. 1 in accordance with the first embodiment of the present invention. As shown, the multiple-phase clock signal generator of the present invention comprises a counter 40 and a plurality of combinational logic gates 52a, 54a, 56a, 58a and 60a. The counter 40 has a clock input that receives the high-frequency oscillating signal on line 18, and a plurality of outputs, e.g. YPO_Q and YP1_Q. The oscillating signal on line 18 continuously drives the counter 40; that is, the counter 40 increments at every cycle of the oscillating signal. In the present embodiment, the counter 40 comprises a 2-stage counter, however, in other embodiments, the counter 40 may be expanded to any number (N) of stages. Preferably, the counter 40 comprises a Johnson counter, i.e., only one of the outputs (YPO_Q, YP1_Q) of the counter 40 changes state at each cycle of the oscillating signal provided on line 18. In the present embodiment, the Johnson counter 40 is implemented by two D flip-flops 70, 72 and an inverter 78.

Preferably, each output (YPO_Q, YP1_Q) of the counter 40 is fed to the input of a respective stage of a register 46. The stages 74, 76 of the register 46 are coupled to the respective outputs $YPO_{13}$ Q, $YP1_{13}$ Q of the counter 40 such that at any given cycle of the driving signal (line 18), the outputs YFO_Q, YF1_Q of the register 46 mirror the outputs $YPO_{-1\ Q}$, $_{YP1}$_Q of the counter 40. That is, the outputs $YFO_{13}$ Q, YF1_Q of the register 46 duplicate the outputs YPO_Q, $YP1_{13}$ Q of the counter 40. As explained below, the register 46 minimizes loading on the counter outputs YPO_Q, $YP1_{13}$ Q.

In greater detail, the register 46 comprises two D flip-flops 74, 76. Flip-flop 74 receives, via inverter 80, the inverted output of flip-flop 72 of the counter 40. The inverter 80 serves to duplicate the input to flip-flop 70 of the counter 40 provided by inverter 78. Flip-flop 76 of the register 46 receives the output of flip-flop 70 of the counter 40, i.e., the input to flip-flop 72. With this arrangement, after each cycle of the driving signal provided on line 18, the state of flip-flop 74 of the register 46 will mirror the state of flip-flop 70 of the counter 40, and flip-flop 76 of the register 46 will mirror flip-flop 72 of the counter 40.

Each of the combinational logic gates 52a, 54a, 56a, 58a, 60a has a plurality of inputs and an output. According to the present invention, each of the combinational logic gates 52a, 54a, 56a, 58a, 60a combines respective ones of the outputs of the counter 40 to provide, at the output thereof, a clock signal having a predetermined phase. The phase of the clock signal output from each combinational logic gate 52a, 54a, 56a, 58a, 60a depends on the particular combination of counter outputs received at the inputs of that combinational logic gate. As shown, some of the combinational logic gates, e.g., 54a, 56a, 58a, receive an inverted output of the counter 40.

According to an important feature of the present invention, as shown in FIG. 2, the inputs of each combinational logic gate 52a, 54a . . . 60a are not coupled directly to the outputs YPO_Q, YP1_Q of the counter 40. Rather, the respective inputs of each combinational logic gate 52a, 54a . . . 60a are coupled to the outputs YFO_Q, YF1_Q of the register 46, which as explained above, duplicate the outputs YPO_Q, YP1_Q of the counter 40. The register 46 serves as a buffer between the counter 40 and combinational logic gates 52a, 54a . . . 60a to minimize loading on the counter outputs YPO_Q, YP1_Q. This reduces skew in the phase generator circuit 20 of the present invention.

Preferably, the output of each combinational logic gate 52a, 54a . . . 60 is coupled in series directly to a respective second combinational logic gate 52b, 54b . . . 60b, forming a respective pair of combinational logic gates. Each of the second combinational logic gates 52b, 54b ... 60b serves to buffer the output of the first combinational logic gate 52a, 54a ... 60a in each pair. As shown, a first pair of combinational logic gates 52 provide a clock signal on line 22 having a phase CLKO_C that is a combination of both register (i.e., counter) outputs $YFO_{13}$ Q and YF1_Q. A second pair of combinational logic gates 54 provide a clock signal on line 24 having a phase CLKO_B that is a combination of the register output $YFO_{13}$ Q and the inverted output of YF1_Q. A third pair of combinational logic gates 56 provide a clock signal on line 26 having a phase CLKO_Z8 that is identical to the phase CLKO_B. A fourth pair of combinational logic gates 58 provide a signal on line 28 having a phase CLKO_CL that is a combination of the register output YF1_Q and the inverted output of YFO_Q. Finally, a last pair of combinational logic gates 60 provide a clock signal on line 29 that is a direct representation of the register output YF1_Q. While the combinational logic gate pairs 52, 54 ... 60 are implemented here using NAND gates, it is understood that the present invention is by no means limited thereto. Rather, any suitable combinational logic gate implementation that achieves similar functionality may be employed.

Figure 3:
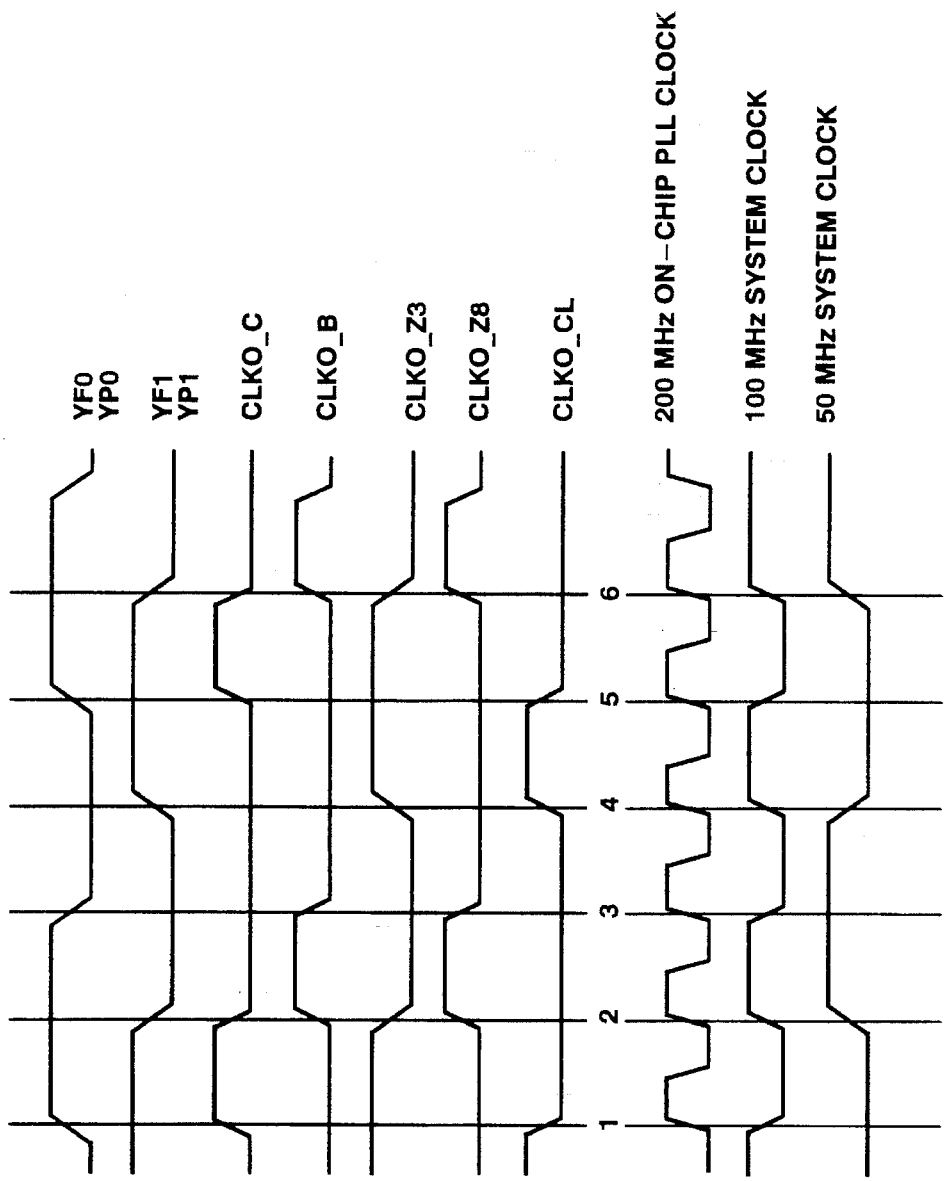
FIG. 3 is a timing diagram illustrating the various phases generated by the multiple-phase clock signal generator of FIGS. 1 and 2.

FIG. 3 is a timing diagram that illustrates the various phases CLKO_C, CLKO_B, CLKO_Z8, CLKO_CL and CLKO_Z3 produced by the respective pairs of combinational logic gates 52, 54 ... 60, as well as illustrating their relationships to the outputs of the counter 40 and duplicating register 46 and to the high frequency oscillating signal (e.g., 200 MHz signal) used to drive the counter 40 and register 46. As shown, the multiple-phase clock signal generator of the present invention is able to produce a plurality of different clock signal phases of varying duty cycles. The multiple-phase clock signal generator of the present invention achieves very precise edge placement due mainly to the fact that both the rising and falling edges of each clock phase are generated from the rising edges of the same high frequency oscillator, i.e., the 200 MHz oscillating signal provided by the PLL 12 on line 18. Using a selected one of the clock phases (e.g., CLKO_B) as the feedback input to the PLL 12 helps minimize chip-to-chip skew as described above. The use of the duplicating registers 46 helps to minimize internal skew between phases. Use of identical clock distribution trees, e.g., 30 and 32, (FIG. 1) to distribute the various clock phases throughout the integrated circuit also serves to minimize internal skew.

According to yet another feature of the present invention, as best illustrated in FIG. 2, at least one of the inputs of each combinational logic gate 52a, 54a ... 60a, or pair of combinational logic gates 52, 54 ... 60, is adapted to receive a control signal for controlling the output of the particular gate, or pair of gates, for initialization, testing, maintenance and debugging purposes. In the present embodiment, each of the first combinational logic gates 52a, 54a ... 60a has one such control input 42, and each of the second combinational logic gates 52b, 54b ... 60b has two inputs 48 that can be used for these purposes. The control inputs 42, 48 can be used to control/disable the various clock phases during initialization, maintenance and testing procedures, such as LSSD, JTAG and the like, that are commonly employed in the design of integrated circuits, and application specific integrated circuits in particular. By providing these control inputs directly on the combinational logic gates 52, 54 ... 60 used to generate the different clock signal phases, the multiple-phase clock signal generator of the present invention provides such initialization, maintenance and testing capabilities without affecting the critical AC paths of the various clock signal phases.

According to yet another feature of the present invention, the combinational logic gate inputs selected to receive the respective outputs of the counter 40 (i.e., register 46) are selected so as to equalize path delays from the outputs of the counter 40 to the outputs of the combinational logic gates 52a, 54a ... 60a. FIG. 2a illustrates this aspect of the present invention in greater detail. In particular, FIG. 2a is an enlarged block diagram of the combinational logic gate 54a used to produce clock phase CLKO_B.

Typically, the respective path delays from the inputs of a logic gate to its output will vary for the different inputs. For example, in FIG. 2a, the delay from input "A" to the output "0" of logic gate 54a may be shorter than the delay from input "C" to output "0". These path delay variations are exploited in the multiple-phase clock signal generator of the present invention to further minimize skew. For example, the inverted counter output YF1_O is coupled to the input with the smallest path delay (e.g., input A) in order to compensate for the delay imposed by the inverter 54c. The non-inverted counter output YFO_Q is coupled to the input having the largest path delay through the gate 54a (e.g., input C). By selecting the gate inputs in this manner, the respective delays experienced by the outputs YFO_Q and $YF1_{13}$ Q are more equalized, thereby reducing skew.

The particular phases illustrated in FIG. 3 can be used to control a wide variety of storage elements in the integrated circuit 10. For example, the phases $CLKO_{13}$ C and CLKO_B can be used to control the master and slave latches, respectively, in a master-slave latch combination, while the other phases can be used to control other storage elements, such as RAM, ROM and the like. Because the phase that clocks the slave latch, i.e., CLKO_B, is also the phase that is fed back to the PLL, the other phases, including CLKO_C, can be disabled using an appropriate one of the inputs 42, 48 in order to allow the PLL to synchronize with CLKO_B without changing the state of other storage elements in the circuit 10.

It is understood that the present invention is by no means limited to the phases illustrated in FIG. 3. Rather, the outputs of the counter 40 can be combined in any number of ways and as required to achieve a particular clock signal phase. Moreover, the number of stages of the counter 40 and register 46 can be increased to provide even greater flexibility in the generation of different clock signal phases and phase duty cycles.

Figure 4:
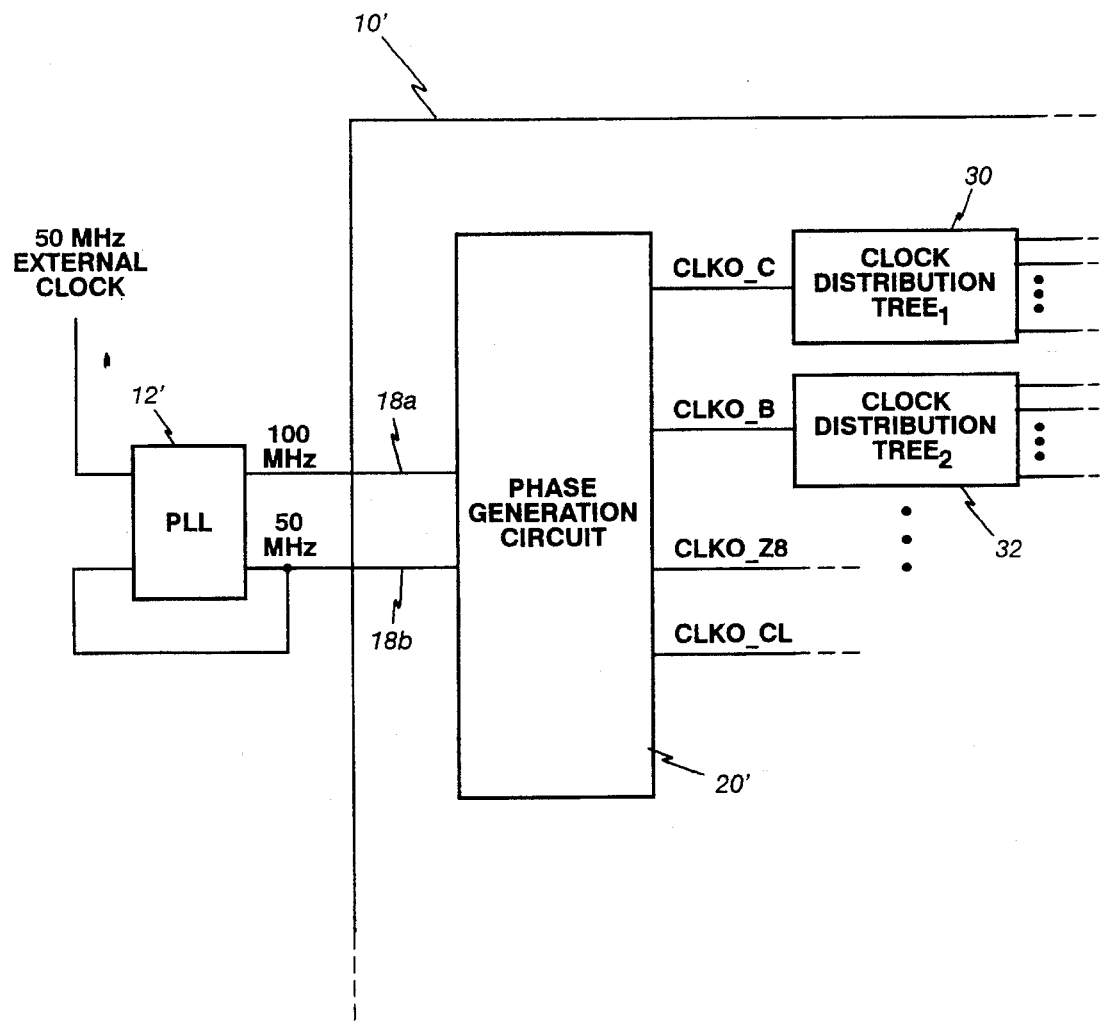
FIG. 4 is a high-level block diagram of an integrated circuit chip embodying a multiple-phase clock signal generator in accordance with a second embodiment of the present invention.

FIG. 4 is a high-level block diagram of a multiple-phase clock signal generator in accordance with a second embodiment of the present invention. The second embodiment differs from the first embodiment in that an external (i.e., off chip) phase-locked loop 12' is employed in place of the internal PLL 12 of the first embodiment. The external PLL 12' provides a 100 MHz high frequency oscillating signal and a 50 MHz sync signal on lines 18a and 18b, respectively. The external 50 MHz sync signal is used to assure chip-to-chip synchronization in the absence of the internal PLL 12 of the first embodiment.

Figure 5:
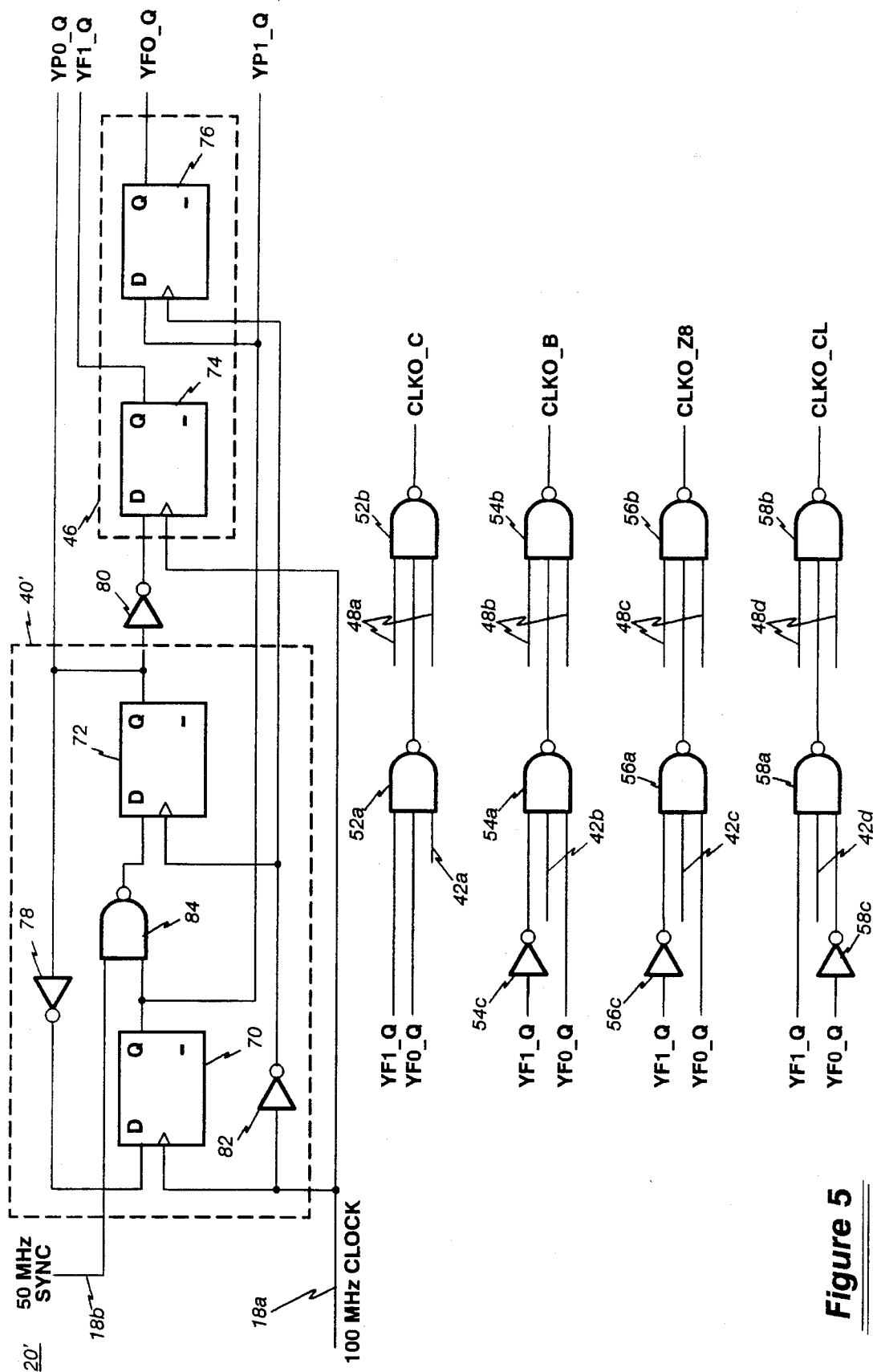
FIG. 5 is a block diagram illustrating further details of the multiple-phase clock signal generator of FIG. 4.

FIG. 5 shows further details of the phase generation circuit 20' of the second embodiment. As shown, the phase generation circuit 20' of the second embodiment is identical to the phase generation circuit 20 of the first embodiment except that the counter 40' has been modified to accept the 100 MHz oscillating signal and 50 MHz sync signal. The input to flip-flop 72 of the counter 40' is gated with the 50 MHz sync signal using an AND gate 84 to ensure that the flip-flop 72 does not change state prematurely. The added inverter 82 serves to produce an effective 200 MHz signal from the 100 MHz external clock signal provided on line 18a. Other than these modifications, the multiple-phase clock signal generator of the second embodiment operates in the same manner as the multiple-phase clock signal generator of the first embodiment.

As the foregoing illustrates, the present invention is directed to a multiple-phase clock signal generator for use in integrated circuit applications. It is understood that changes may be made to the embodiments described above without departing from the broad inventive concepts thereof. Accordingly, the present invention is not limited to the particular embodiments disclosed, but is intended to cover all modifications that are within the spirit and scope of the invention as defined by the appended claims.

What is claimed is:

1. A multiple-phase clock signal generator comprising:
   a phase-locked loop (PLL) that provides an oscillating signal at an output thereof, said phase-locked loop having a feedback input;
   a counter having a clock input and a plurality of outputs, the clock input of the counter being coupled to the output of the PLL for receiving said oscillating signal to drive said counter continuously;
   a plurality of combinational logic gates each having a plurality of inputs and an output, selected ones of the inputs of each combinational logic gate being coupled to selected ones of the outputs of said counter for combining said selected outputs of the counter to produce, at the output of said each combinational logic gate, a clock signal having a predetermined phase, at least some of said combinational logic gates combining different selected ones of the outputs of said counter to produce clock signals having different phases,
   the clock signal output from one of said combinational logic gates being fed back to the feedback input of said PLL.

2. The multiple-phase clock signal generator recited in claim 1 wherein said counter comprises a Johnson counter.

3. The multiple-phase clock signal generator recited in claim 1 wherein each of said combinational logic gates has at least one input for receiving a control signal for controlling the output of said each combinational logic gate.

4. The multiple-phase clock signal generator recited in claim 1 wherein each of said combinational logic gates comprises a pair of combinational logic gates coupled in series.

5. The multiple-phase clock signal generator recited in claim 1 wherein the output of each of said combinational logic gates is coupled to a respective clock distribution tree, and wherein an output/of a selected one of said clock distribution trees is coupled to the feedback input of said PLL for feeding back said one clock signal to the feedback input of said PLL.

6. The multiple-phase clock signal generator recited in claim 1 further comprising a duplicating register coupled between the outputs of said counter and the respective inputs of said combinational logic gates for duplicating the outputs of said counter to minimize loading on said counter outputs.

7. A multiple-phase clock signal generator comprising:
   means for generating an oscillating signal having a predetermined frequency and phase;
   a counter having a clock input and a plurality of outputs, the clock input of the counter being coupled to receive said oscillating signal for driving said counter continuously;
   a plurality of combinational logic gates each having a plurality of inputs and an output, selected ones of the inputs of each combinational logic gate being coupled to selected ones of the outputs of said counter for combining said selected outputs of the counter to produce, at the output of said each combinational logic gate, a clock signal having a predetermined phase, at least some of said combinational logic gates combining different selected ones of the outputs of said counter to produce clock signals having different phases, and
   each of said combinational logic gates having at least one input for receiving a control signal for controlling the output of said each combinational logic gate.

8. The multiple-phase clock signal generator recited in claim 7 wherein said counter comprises a Johnson counter.

9. The multiple-phase clock signal generator recited in claim 7 wherein each of said combinational logic gates comprises a cascaded pair of combinational logic gates.

10. The multiple-phase clock signal generator recited in claim 7 wherein said means for generating an oscillating signal comprises a phase-locked loop (PLL) that provides said oscillating signal at an output thereof, said PLL having a feedback input, and wherein the clock signal output from one of said combinational logic gates is fed back to the feedback input of said PLL.

11. The multiple-phase clock signal generator recited in claim 10 wherein the output of each of said combinational logic gates is coupled to a respective clock distribution tree, and wherein an output of a selected one of said clock distribution trees is coupled to the feedback input of said PLL for feeding back said one clock signal to the feedback input of said PLL.

12. The multiple-phase clock signal generator recited in claim 7 further comprising a duplicating register coupled between the outputs of said counter and the respective inputs of said combinational logic gates for duplicating the outputs of said counter to minimize loading on said counter outputs.

13. A multiple-phase clock signal generator comprising:
   means for generating an oscillating signal having a predetermined frequency and phase;
   an N-stage counter having a clock input and a plurality, N, of outputs, the clock input of the counter being for receiving said oscillating signal for driving said counter continuously;
   an N-stage register having a clock input for receiving said oscillating signal, each stage of said register having an input and an output, the input of each stage of the register being coupled to a respective one of the N outputs of said counter, the N outputs of said register duplicating the N outputs of said counter;
   a plurality of combinational logic gates each having a plurality of inputs and an output, selected ones of the inputs of each combinational logic gate being coupled to selected ones of the outputs of said register for combining said selected outputs of the register to produce, at the output of said each combinational logic gate, a clock signal having a predetermined phase, at least some of said combinational logic gates combining different selected ones of the outputs of said register to produce clock signals having different phases.

14. The multiple-phase clock signal generator recited in claim 13 wherein each of said combinational logic gates has at least one input for receiving a control signal for controlling the output of said each combinational logic gate.

15. The multiple-phase clock signal generator recited in claim 13 wherein said counter comprises a Johnson counter.

16. The multiple-phase clock signal generator recited in claim 13 wherein each of said combinational logic gates comprises a cascaded pair of combinational logic gates.

17. The multiple-phase clock signal generator recited in claim 13 wherein said means for generating an oscillating signal comprises a phase-locked loop (PLL) that provides said oscillating signal at an output thereof, said PLL having a feedback input, and wherein the clock signal output from one of said combinational logic gates is fed back to the feedback input of said PLL.

18. The multiple-phase clock signal generator recited in claim 17 wherein the output of each of said combinational logic gates is coupled to a respective clock distribution tree, and wherein an output of a selected one of said clock distribution trees is coupled to the feedback input of said PLL for feeding back said one clock signal to the feedback input of said PLL.

* * * * *